United States Patent [19]

Henry et al.

[11] 4,097,986

[45] Jul. 4, 1978

[54] MANUFACTURING PROCESS FOR THE COLLECTIVE PRODUCTION OF SEMICONDUCTIVE JUNCTION DEVICES

[75] Inventors: Raymond Henry; Alain Chapard, both of Paris, France

[73] Assignee: Thomson-CSF, Paris, France

[21] Appl. No.: 748,879

[22] Filed: Dec. 9, 1976

[30] Foreign Application Priority Data

Dec. 12, 1975 [FR] France ................. 75 38109

[51] Int. Cl.² ........................................ B01J 17/00
[52] U.S. Cl. ............................ 29/583; 29/580; 29/576 W
[58] Field of Search ............ 29/576 IW, 580, 583, 29/578

[56] References Cited

U.S. PATENT DOCUMENTS

| | | | |
|---|---|---|---|
| 3,290,753 | 12/1966 | Chang | 29/576 IW |
| 3,400,309 | 9/1968 | Doo | 29/576 IW |
| 3,895,429 | 7/1975 | Huang | 29/580 |
| 3,896,478 | 7/1975 | Henry | 357/56 |

*Primary Examiner*—W. Tupman
*Attorney, Agent, or Firm*—Oblon, Fisher, Spivak, McClelland & Maier

[57] ABSTRACT

A process intended for combining the "flip-chip bonding" technique with a method yielding diodes of very thin substrate forming mesa units or clumps etched out in a dielectric block embedding the semiconductor body. The process comprises, starting from a semiconductive wafer, a double mesa etching and a double lapping, each of them carried out on each side of the wafer, due to a thick dielectric layer and a thick metallic support respectively brought in at the right moment.

7 Claims, 4 Drawing Figures

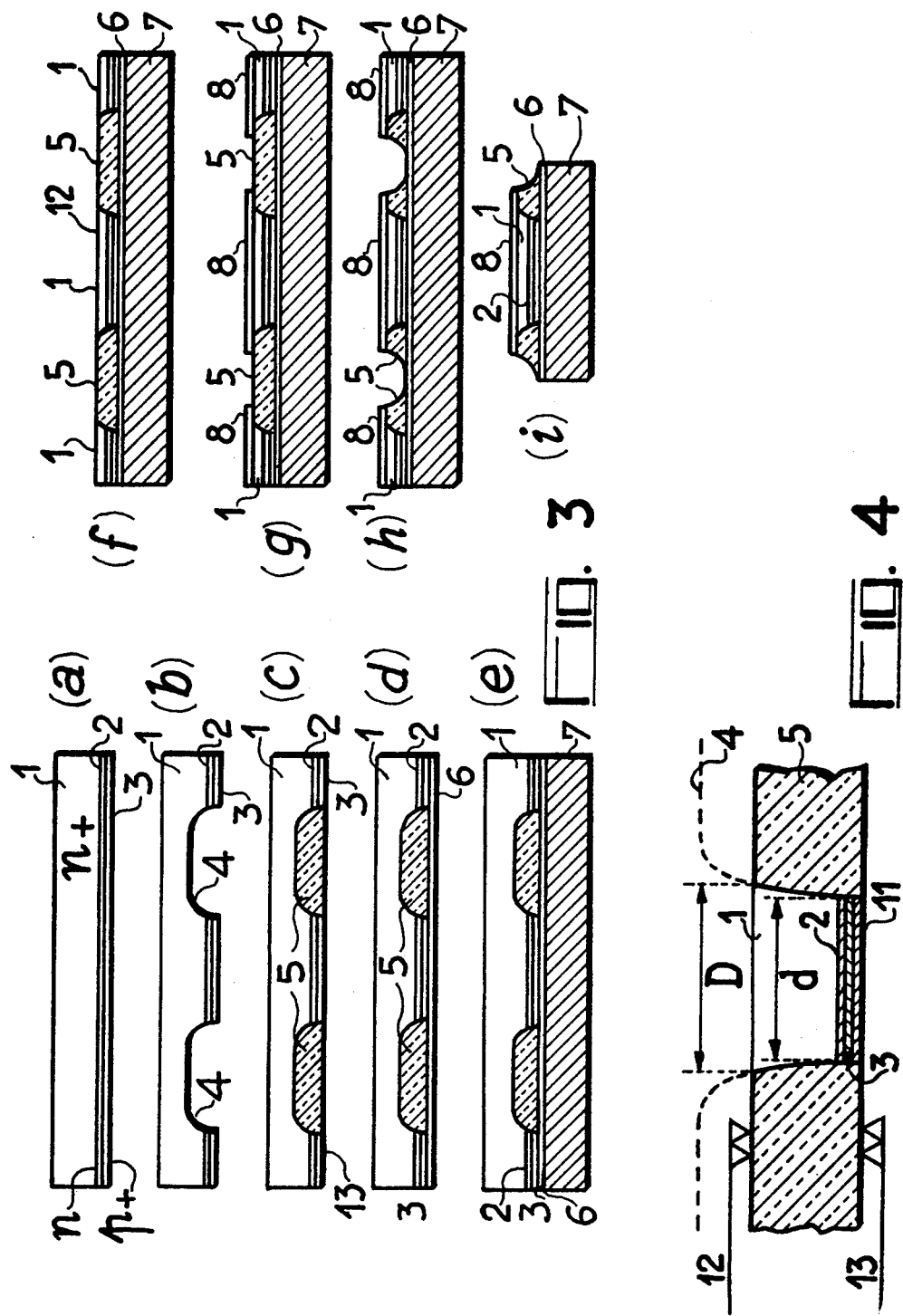

MANUFACTURING PROCESS FOR THE COLLECTIVE PRODUCTION OF SEMICONDUCTIVE JUNCTION DEVICES

This invention relates to the production of semiconductor devices comprising, as close as possible to a heat-dissipating support, a semiconductive junction obtained by a diffusion or epitaxial process, starting from a semiconductor substrate. Devices such as these, which have the considerable advantage of low thermal resistance, are used in particular in oscillator circuits where they can perform the function of an avalanche diode or a varactor. The last of these fuctions also makes them suitable for use in frequency conversion, parametric amplification and the filtering of electrical signals. Apart from their favourable heat-dissipating properties, which provide these electronic components with high reliability, it is important, both for operation at very high frequency and to obtain a high energy yield, that these components should also show a low series resistance, low inductance of the connections and reduced parasitic capacitance. Finally, to reduce production costs, it is advisable to adopt a structure which is adapted to collective production and a manufacturing process which reduces waste and is relatively flexible, i.e. may be used for the production either of insulated diodes or of more complex assemblages using one or several diodes with or without impedance adapting means.

Conventional devices, which have the feature of a junction welded as close as possible to a heat-dissipating support, are made be individual or collective processes, but unfortunately it is not possible with these processes to reconcile all the qualities mentioned above.

Disadvantages which have been encountered include: the danger of the junction being short-circuited during the operation of welding or fixing by thermocompression; the relatively high value of the series resistance of the substrate which has to be reduced by lapping without making the best possible use of this operation; the difficulty of obtaining a low inductance connection when the contact surface is smaller than the junction, and the high parasitic capacitance observed when no measures have been taken to avoid excessive enlargement of the substrate.

The invention aims at preventing those disavantages. According to the invention, there is provided a manufacturing process for the collective production of semiconductor devices, comprising the following steps:

A. Starting from a semiconductor wafer of a predetermined type of conductivity, forming a first layer of said type of conductivity more weakly doped than said wafer, then forming at least a second semiconductive layer of the opposite type of conductivity;

B. Creating grooves by mesa etching of the wafer on the side of said layers;

C. Filling said grooves with a dielectric material and lapping said wafer on the side of said material to make it level with said layers;

D. Depositing a conductive layer onto the flat surface formed at step (C);

E. Adding metal to form a heat-dissipating support;

F. Lapping said wafer on its free face so as to bring it to a uniform thickness less than the depth of said grooves;

G. Selectively depositing metal onto the surface obtained at step (F) to cover the semiconductive material left by said lapping;

H. Etching said dielectric material to obtain grooves onto said wafer;

I. Cutting said wafer along said grooves.

The invention will be better understood from the following description in conjunction with the accompanying drawings, wherein:

FIG. 3 illustrates the successive steps (a) to (i) of the process according to the invention.

FIG. 4 is an explanatory figure.

Figure 1:
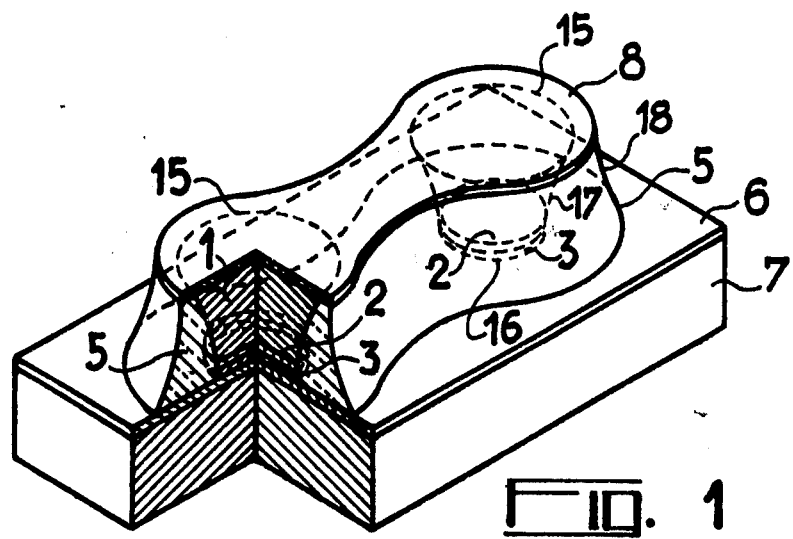
FIG. 1 is a partial isometric view of a device with two diodes according to the invention.

FIG. 1 shows a device comprising two diodes with a heat-dissipating support 7 made of a highly heat-conductive metal and surmonted by a barrier layer 6, for exemple of chromium. Two doped semiconductor bodies 1 rest on the layer 6, being delimited by the face 16 adjoining doped layer 3 which has the conductivity type opposite to that of the upper part of the bodies 1. Amore weakly doped sublayer 2 which has the same conductivity type as the upper part of the bodies 1 forms a junction with the layer 3. The surface 15 of the bodies 1 opposite the junction is provided with a conductive deposit 8 which connects the diodes thus formed in parallel. This electrical connection 8 forms part of a transmission line with the support 6, 7. The lateral wall 17 of the bodies 1 has a widening which appears more or less pronounced on moving away from the support because this profile has been obtained by a chemical attack progressing from the plane of the layer 6.

In FIG. 1, the structure is reinforced by a coating 5 of dielectric material. This coating may serve to support the deposit 8 and, at the same time, ensures passivation of the layers 2 and 3. The dielectric coating also contributes towards the dissipation of heat and its lateral wall 18 has a widening directed oppositely to that of the bodies 1 because this wall has been delimited by a chemical attack progressing from the plane of the surfaces 15.

The structure shown in FIG. 1 has significant advantages. The thickness of the dielectric material is considerable in the vicinity of the junctions which provides for excellent passivation. The surface 15 opposite the junction is at least equal in size to the junction which facilitates the formation of low-inductance connections by wide tape. The dielectric material 5 is a better conductor of heat than air. The upper part of the semiconductor body may have been lapped in such a way as to produce a low series resistance. The parasitic capacity is low because the deposit 15 is limited in extent above the support 6, 7. This extent may be reduced even further by prolonging the chemical attack of the dielectric material 5 until it is only present at the level of the layers 2 and 3 forming the junction. The device is ideal in regard to the dissipation of heat via the support 6, 7, resulting in reliable operation even when the dissipated power or the ambient temperature are considerable. The combination of several diodes with their interconnection in one and the same device does not involve any complications during production and enables the application thereof to be simplified.

Figure 2:
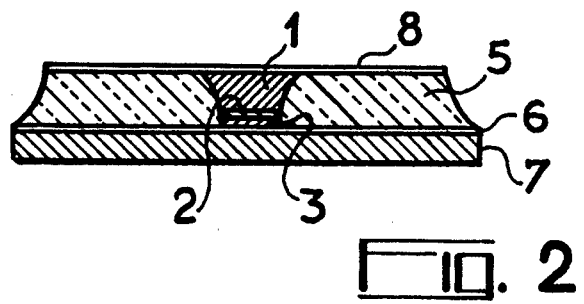
FIG. 2 is a section through a diode according to the invention formed with a radial impedance transforming cavity.

FIG. 2 shows a modified embodiment which considerably facilitates adjustment during use, especially during operation as an avalanche diode. The dielectric material 5 forms a coating which may extend largely around the semiconductor body 1 of the diode. The metallic deposit 8 also extends over the entire coating 5, forming a radial transmission line with the support 6, 7. This radial line may serve as a step-up impedance transformer and even as a resonance cavity.

The manufacturing process is illustrated in FIG. 3. The case of diodes made from a N+ doped silicon wafer has been taken as a non-limiting example. To form the junction, an N type layer more weakly doped than the starting wafer is created by epitaxial growth on the wafer 1. A P+ type layer 3 is then grown. The wafer 1 may have a thickness of for example 50 microns, whilst the layers 2 and 3 are appreciably thinner. A wafer shown at (a) in FIG. 3 is obtained in this way.

It is of course also possible in accordance with the invention for the layers 2 and 3 forming the junction to be obtained by diffusion.

The following step of the process consists in making a chemical attack of the MESA type progressing from the junction so as to form grooves 4 which delimit the future diodes. At this step, the disc has the appearance illustrated by the section (b) in FIG. 3. A deposit of dielectric material 5 is then applied in order completely to fill the grooves 4. Lapping is then necessary for removing the surplus dielectric material and leading to the section (c) in FIG. 3 which is characterised by a flat lapped surface 13 bringing the dielectric material 5 to the same level as the free surface of the layer 3. It is important to ensure that this lapping operation does not cut too deeply into the layer 3. The dielectric material 5 should completely fill the grooves 4 and it is possible to use for example glass which is deposited in molten form on the junction side.

The following step consists in covering the lapped surface 13 with a thin film 6 of barrier metal, such as chromium, which leads to the structure illustrated at (d) in FIG. 3. The structure shown at (e) in FIG. 3 additionally comprises a metal plate 7 intended to form the heat-dissipating support of the devices produced. This plate 7 may be formed by a thick electrolytic deposit on the film 6. A plate 7 may also be fixed to the layer by thermocompression. Since the metal forming the heat-dissipating support has to be good conductor of heat, it is possible for example to use gold or copper.

The structure shown at (e) in FIG. 3 has sufficient rigidity for the following step which consists in lapping the disc 1 on that side opposite the junction. This lapping operation has to be continued until the disc 1 has a thickness which is less than the depth of the grooves 4, but which of course remains greater than the total thickness of the layers 2 and 3. The result of the lapping operation is shown at (f) in FIG. 3. It can be seen that the dielectric material 5 is level with the lapped surface 12 and that the future diodes are no longer interconnected by the heavily doped semiconductor substrate.

After lapping, the surface 12 receives a selective metallic deposit 8 which covers the levellings of semiconductor material. This deposit 8 may also extend further in order partly to cover the dielectric material 5. The covering of the dielectric material 5 by the deposit 8 may even extend to the point where it joins together two or more diodes as illustrated in FIG. 1. Irrespective of the extent of the deposit 8, the structure illustrates at (g) in FIG. 3 is ultimately obtained. A second chemical attack is then made to form separation grooves in the dielectric material 5. This chemical attack progresses from the surface bearing the deposit 8 and continues until it reaches the barrier layer 6. The structure illustrates at (h) in FIG. 3 is thus obtained. All that remains is to cut the support 7 at the bottom of the grooves formed by the chemical attack of the dielectric material 5 to obtain devices similar to that shown at (i) in FIG. 3.

FIG. 4 shows on a larger scale the configuration of the semiconductor body 1 at the step (f) of FIG. 3. The doped layers 2 and 3 forming the junction have an extent d smaller than the extent D of the semiconductor zone which is level after lapping (shown as a symbol 12). In a variant of the process, between steps (c) and (d) of FIG. 3, a barrier layer 11 has been deposited onto the layer 3 so that the lapping shown as a symbol 13 may be carried out more easily without any danger of cutting into the layer 3.

FIG. 4 also shows the profile of the chemical attack forming the grooves 4. It can be seen that the lapping 12 takes place below the bottom of the grooves 4 so as to reduce the series resistance and parasitic capacitance of the diode.

What we claim is:

1. A manufacturing process for the collective production of semiconductor devices, comprising the following steps:
   A. starting from a semiconductor wafer of a predetermined type of conductivity, forming a first layer of said type of conductivity more weakly doped than said wafer, when forming at least a second semiconductive layer of the opposite type of conductivity;
   B. creating grooves by mesa etching of the wafer on the side of said layers;
   C. filling said grooves with a dielectric material and lapping said wafer on the side of said material to make it level with said layers;
   D. depositing a conductive layer onto the flat surface formed at step (C);
   E. adding metal to form a heat-dissipating support;
   F. lapping said wafer on its free face so as to bring it to a uniform thickness less than the depth of said grooves;
   G. selectively depositing metal onto the surface obtained at step (F) to cover the semiconductive material left by said lapping;
   H. etching said dielectric material to obtain grooves onto said wafer;
   I. cutting said wafer along said grooves.

2. A manufacturing process as claimed in claim 1, wherein, at step (C), said filling is obtained by the deposition of molten glass.

3. A manufacturing process as claimed in claim 1, wherein at step (G) said selective deposit combines at least two diodes and at step (H) etching takes place along a line surrounding the diodes joined by said deposit.

4. A manufacturing process as claimed in claim 1, wherein at step (G) said selective deposit only covers said semiconductor material.

5. A manufacturing process as claimed in claim 1, wherein at step (G) said selective deposit simultaneously covers said semiconductor material and dielectric material surrounding it.

6. A manufacturing process as claimed in claim 1, wherein at step (H) etching of said dielectric material is continued up to the layer deposited at step (D).

7. A manufacturing process as claimed in claim 6, wherein at the step (H) etching of said dielectric material is continued to the point of complete removal.

* * * * *